United States Patent
Kim et al.

(10) Patent No.: US 10,234,515 B2
(45) Date of Patent: Mar. 19, 2019

(54) METHOD FOR CONTROLLING OF HALL DEVICE AND MAGNETIC DETECTION APPARATUS USING THE SAME

(71) Applicant: Haechitech Corporation, Cheongju-si (KR)

(72) Inventors: Dong Ho Kim, Cheongju-si (KR); Yong Sup Lee, Cheongju-si (KR)

(73) Assignee: Haechitech Corporation, Cheongju-si (KR)

( * ) Notice: Subject to any disclaimer, the term of this patent is extended or adjusted under 35 U.S.C. 154(b) by 456 days.

(21) Appl. No.: 15/085,567

(22) Filed: Mar. 30, 2016

(65) Prior Publication Data

US 2016/0370439 A1    Dec. 22, 2016

(30) Foreign Application Priority Data

Jun. 16, 2015 (KR) .................. 10-2015-0084806

(51) Int. Cl.
| | |
|---|---|
| *H02M 1/00* | (2006.01) |
| *G01R 33/07* | (2006.01) |
| *H02J 1/00* | (2006.01) |
| *H01L 21/00* | (2006.01) |

(52) U.S. Cl.
CPC ............ *G01R 33/07* (2013.01); *H01L 21/00* (2013.01); *H01L 2221/00* (2013.01); *H02J 1/00* (2013.01)

(58) Field of Classification Search
CPC .. H02M 1/00; H02J 1/00; H01L 21/00; H01L 2221/00
See application file for complete search history.

(56) References Cited

U.S. PATENT DOCUMENTS

| | | | |
|---|---|---|---|
| 9,921,274 B2* | 3/2018 | Kim ................ | G01D 5/145 |
| 2008/0238410 A1* | 10/2008 | Charlier ............ | G01R 33/0017 324/202 |
| 2009/0201220 A1* | 8/2009 | Kim ................ | H01Q 9/285 343/907 |
| 2009/0268496 A1* | 10/2009 | Tan .................. | H02M 1/4216 363/126 |
| 2009/0271142 A1 | 10/2009 | Yamashita et al. | |
| 2012/0153945 A1* | 6/2012 | Ezekwe ............ | G01R 33/0023 324/251 |
| 2014/0145714 A1* | 5/2014 | Okatake ............ | G01R 33/07 324/225 |

FOREIGN PATENT DOCUMENTS

JP      2005-283503 A      10/2005

* cited by examiner

*Primary Examiner* — Jermele M Hollington
*Assistant Examiner* — Temilade S Rhodes-Vivour
(74) *Attorney, Agent, or Firm* — NSIP Law

(57) ABSTRACT

A magnetic detection apparatus includes a Hall device configured to include terminals and to generate an electromotive force based on a magnetic field, a Hall output controller configured to control an output of the Hall device such that an output phase alteration order of a first section of the output is symmetrical to an output phase alteration order of a second section of the output on the basis of half cycle of a control cycle of the Hall device, an amplifier configured to be connected to output terminals of the Hall device to amplify the output of the Hall device, and an amplifier output controller configured to control an output polarity of the amplifier based on the output of the Hall device.

19 Claims, 11 Drawing Sheets

$V_1 = V_H + V_{OH} + V_{OA}$
$V_2 = V_1$ $V_1 = V_H - V_{OH} + V_{OA}$
$V_2 = V_1$ $V_1 = -V_H - V_{OH} + V_{OA}$
$V_2 = -V_1$ $V_1 = -V_H + V_{OH} + V_{OA}$
$V_2 = -V_1$

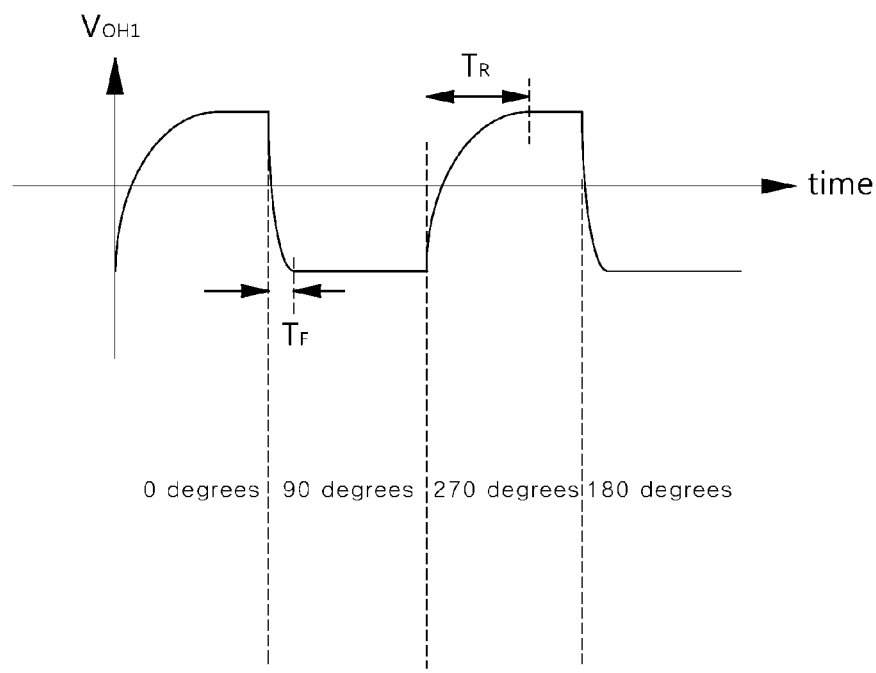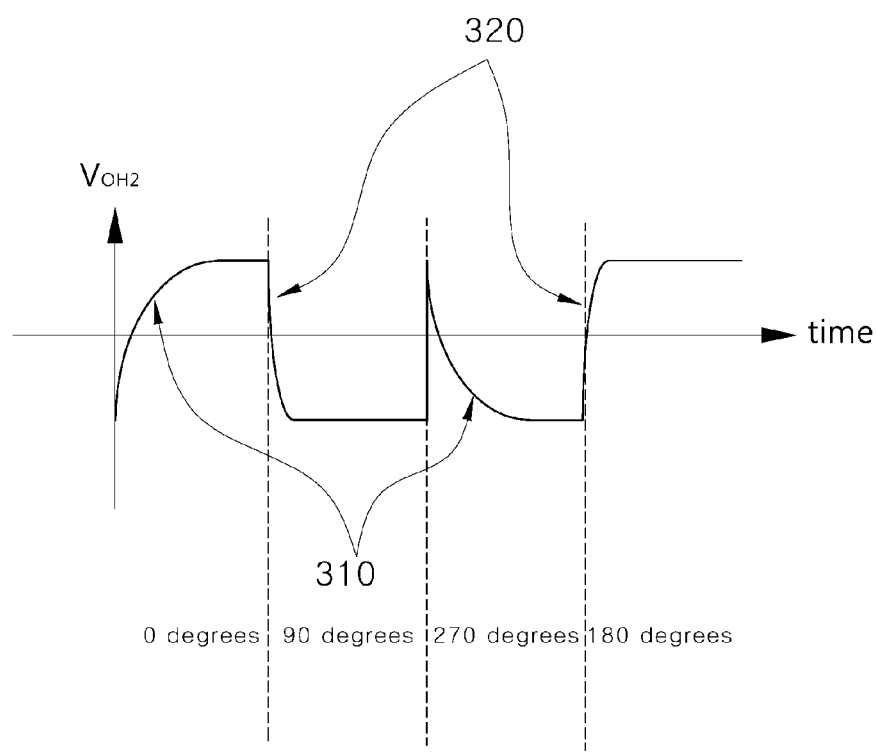
FIG. 3

FIG. 4
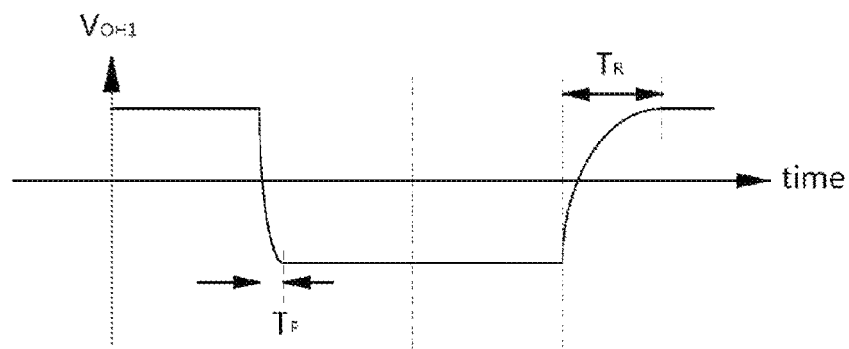
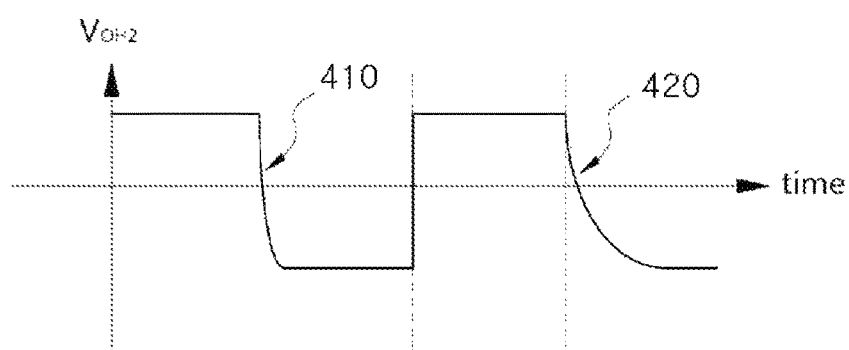

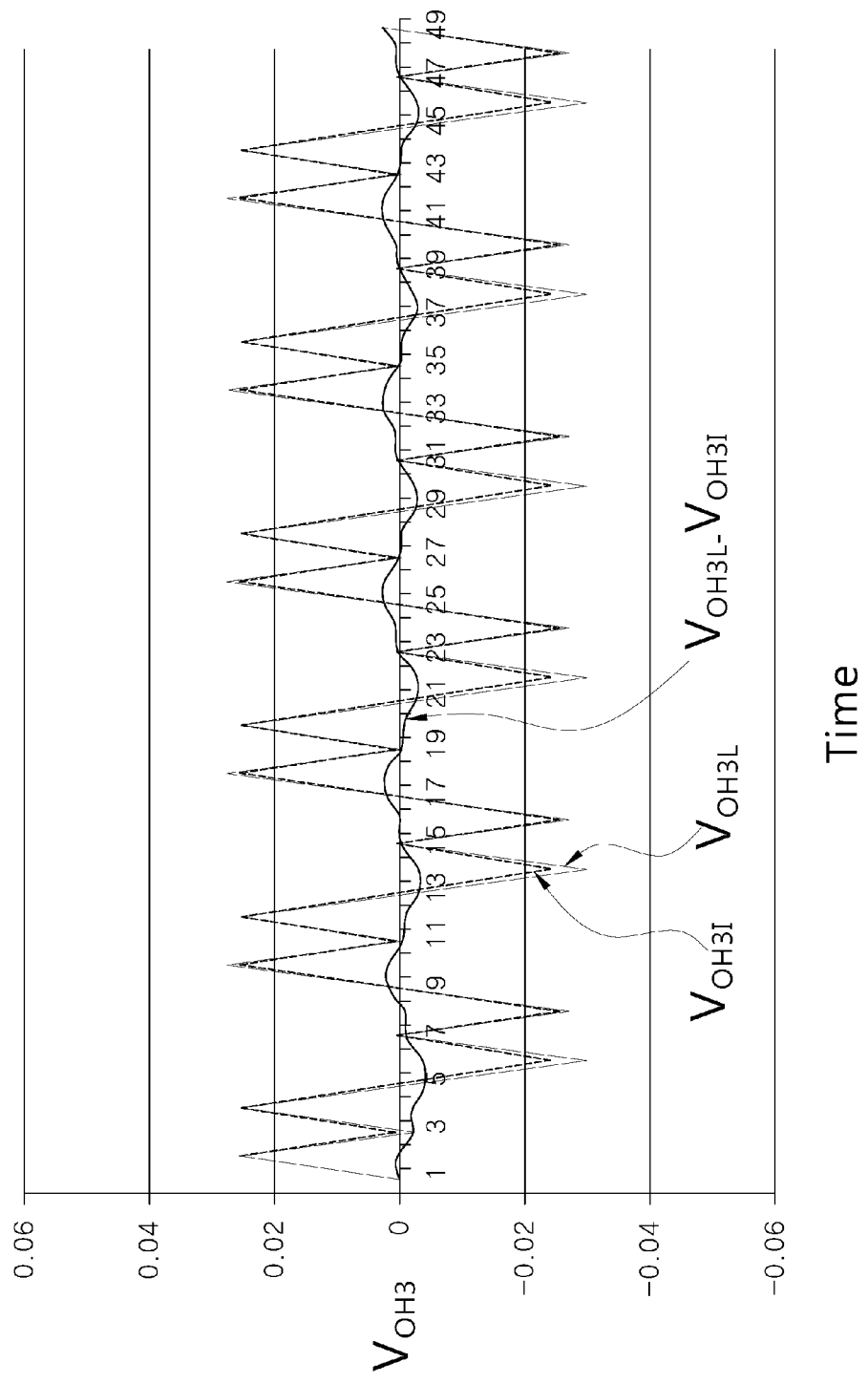

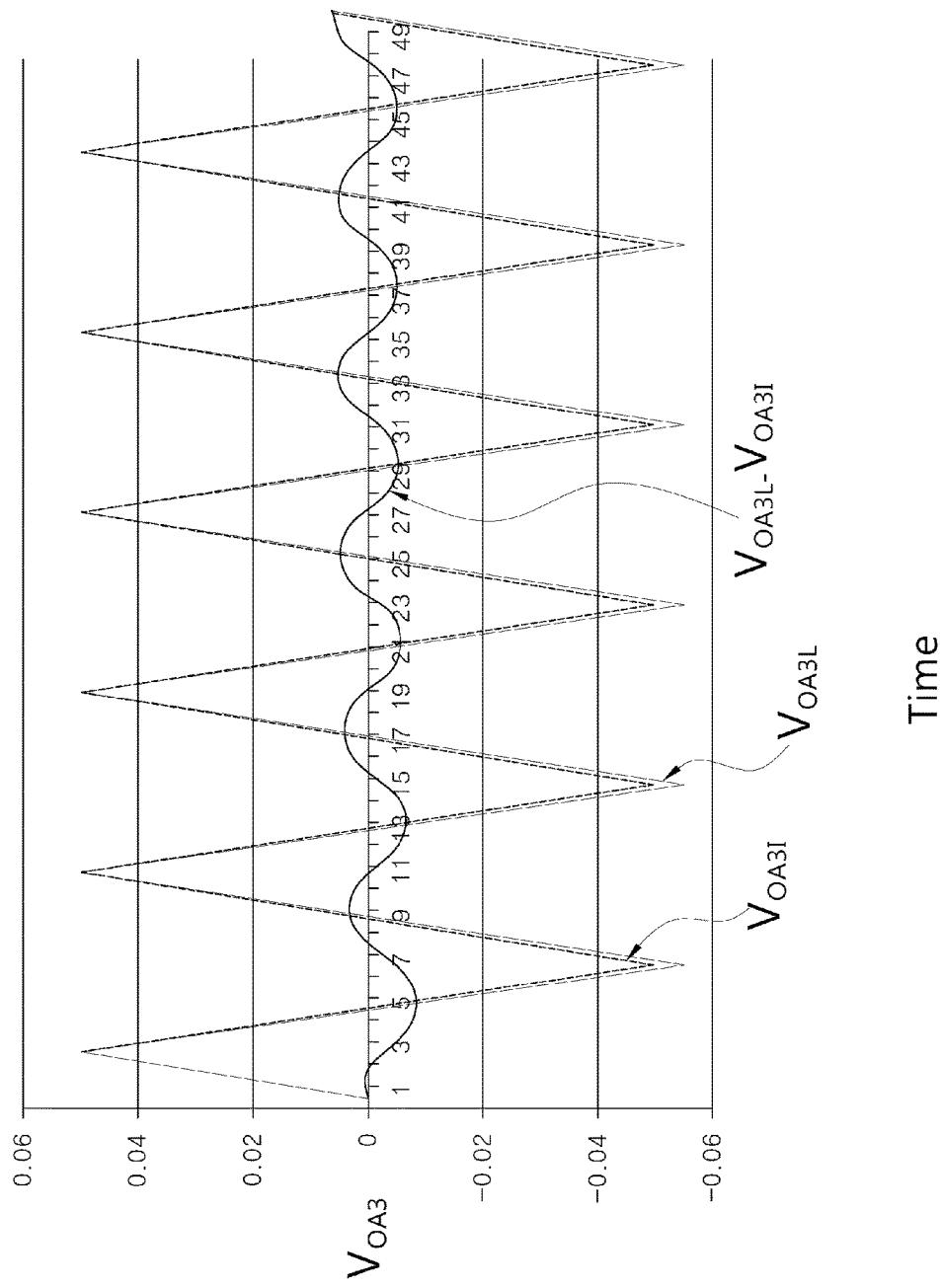

METHOD FOR CONTROLLING OF HALL DEVICE AND MAGNETIC DETECTION APPARATUS USING THE SAME

CROSS-REFERENCE TO RELATED APPLICATION(S)

This application claims the benefit under 35 USC 119(a) of Korean Patent Application No. 10-2015-0084806 filed on Jun. 16, 2015 in the Korean Intellectual Property Office, the entire disclosure of which is incorporated herein by reference for all purposes.

BACKGROUND

1. Field

The following description relates to a control technology of a Hall device, and a Hall device using such a control technology. The following description also relates to a method for controlling of a Hall device and a magnetic detection apparatus using such a Hall device to control an output of the Hall device to improve performance of an analog to digital converter.

2. Description of Related Art

Recently, a demand for a magnetic measuring apparatus is increasing. Such a magnetic measuring apparatus is required to be smaller, to be faster, and to measure a value accurately. For example, research is actively underway for improving performance through a control method of a Hall device so that a magnetic measuring apparatus is able to effectively measure a magnetic field in comparison with definite hardware and time requirements. The Hall device may control a direction of bias current passing in the Hall device to control a phase of an output voltage. When the magnetic measuring apparatus is embodied according to alternative technology, the Hall device and an amplifier in the magnetic measuring apparatus may generate an offset voltage.

Alternative technology may remove a prospective offset voltage of a Hall device and an amplifier in the process of controlling the Hall device. However, such alternative technology may generate a remaining offset voltage by power dissipation during a rising time and a falling time of an amplifier output. That is, because the prospective offset voltage of the amplifier increases a remaining offset voltage, a control method of the Hall device by the alternative technology accordingly has an issue of hindering performance of an analog to digital converter. Also, even though the prospective offset voltage of the amplifier or remaining offset voltage is removed, there is an issue that a remaining offset of the amplifier generated at a leakage integrator still increases.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a magnetic detection apparatus includes a Hall device configured to include terminals and to generate an electromotive force based on a magnetic field, a Hall output controller configured to control an output of the Hall device such that an output phase alteration order of a first section of the output is symmetrical to an output phase alteration order of a second section of the output on the basis of a half cycle of a control cycle of the Hall device, an amplifier configured to be connected to output terminals of the Hall device to amplify the output of the Hall device, and an amplifier output controller configured to control an output polarity of the amplifier based on the output of the Hall device.

The magnetic detection apparatus may further include an integrator configured to integrate an output of the amplifier output controller.

The Hall output controller may control the output of the Hall device such that the output phase alteration order of the first section corresponds to a reverse order of the output phase alteration order of the second section during the control cycle of the Hall device.

The control cycle of the Hall device may correspond to a section of the output in which an output phase of the Hall device changes 8 times.

The Hall output controller may change the output phase of the Hall device 4 times during the first section of the output and changes the output phase of the Hall device 4 times in a reverse order of the output phase alteration order of the first section during the second section of the output.

The Hall output controller may change the output phase of the Hall device in an order of 0 degrees, 90 degrees, 180 degrees and 270 degrees during the first section of the output and may change the output phase of the Hall device in an order of 270 degrees, 180 degrees, 90 degrees and 0 degrees during the second section of the output.

The Hall output controller may select two output terminals from among the terminals of the Hall device to be used to change the output phase of the Hall device.

The Hall output controller may select terminals from among the terminals of the Hall device that are not to be used as output terminals as bias terminals.

The Hall output controller may control the output of the Hall device such that a rising time loss quantity related to the output the amplifier output controller is identical to a falling time loss quantity related to the output the amplifier output controller during the control cycle of the Hall device.

The Hall output controller may cause the rising time loss quantity and the falling time loss quantity be identical to each other such that a remaining offset voltage of the amplifier is removed.

In another general aspect, a magnetic detection apparatus includes a Hall device configured to include terminals and to generate an electromotive force based on a magnetic field, a Hall output controller configured to select two output terminals from among the terminals to control the output phase of the Hall device, an amplifier configured to connect to the selected output terminals to amplify the output of the Hall device, an amplifier output controller configured to control an output polarity of the amplifier based on the output of the Hall device, and an integrator configured to integrate an output of the amplifier output controller, wherein the Hall output controller controls the output of the Hall device such that a rising time loss quantity related to an output of the amplifier output controller is identical to a falling time loss quantity related to an output of the amplifier output controller.

The Hall output controller may change the output phase of the Hall device 8 times during one control cycle of the Hall device.

The Hall output controller may change the output phase of the Hall device 4 times during a first section of a control cycle of the Hall device and the output phase of the Hall device 4 times in reverse order of the output phase alteration order of the first section during a second section of the control cycle of the Hall device.

The Hall output controller may change the output phase of the Hall device in order 0 degrees, 90 degrees, 180 degrees and 270 degrees during the first section and the output phase of the Hall device in order 270 degrees, 180 degrees, 90 degrees and 0 degrees during the second section.

In another general aspect, a method for controlling a Hall device includes using a Hall device including terminals to generate an electromotive force, controlling an output of the Hall device so that an output phase alteration order of a first section of the output is symmetrical to an output phase alteration order of a second section of the output on the basis of a half cycle of a control cycle of the Hall device;

amplifying an output of the Hall device, and controlling an output polarity of an amplifier based on the output of the Hall device.

The method may further include integrating an output based on the controlled output polarity of the amplifier.

Other features and aspects will be apparent from the following detailed description, the drawings, and the claims.

BRIEF DESCRIPTION OF THE DRAWINGS

FIG. 3 is a waveform diagram illustrating an offset voltage change of a Hall device according to an output phase change of the Hall device in respect of an alternative technology.

FIG. 4 is a waveform diagram illustrating an offset voltage change of a Hall device differing from an output phase alteration order of the Hall device as shown in FIG. 3.

FIG. 6A is a waveform diagram illustrating an output of an integrator in respect of an offset voltage of a Hall device in the embodiment of FIG. 1.

FIG. 6B is a waveform diagram illustrating an output of an integrator in respect of an offset voltage of an amplifier in the embodiment of FIG. 1.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
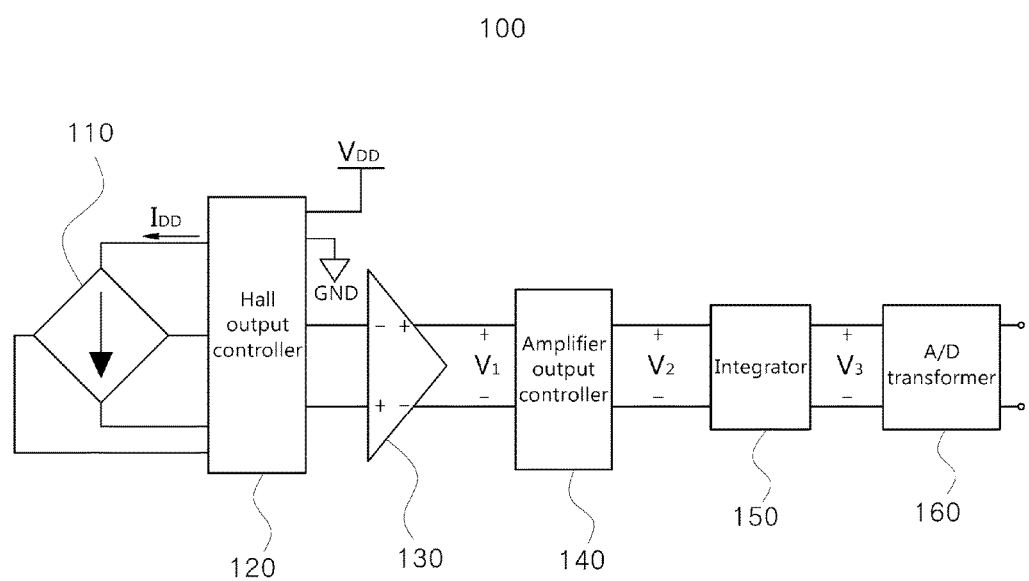
FIG. 1 is a block diagram illustrating a magnetic detection apparatus according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

While terms such as "first," "second," and the like, are used to describe various components, such components are not to be understood as being limited to the terms. The terms are merely used to help the reader to distinguish one component from another.

It is to be understood that when an element is referred to as being "connected to" or "connected with" another element, the element is possibly directly connected to the other element or intervening elements are also possibly present. In contrast, when an element is referred to as being "directly connected to" another element, no intervening elements are intended to be present, except where the context makes it clear that other intervening elements may be present. In addition, unless explicitly described to the contrary, the word "comprise" and variations such as "comprises" or "comprising," or synonyms such as "including" or "having," are to be understood to imply the inclusion of stated elements but not the exclusion of any other elements. Meanwhile, other expressions describing relationships between components such as "between", "immediately between" or "adjacent to" and "directly adjacent to" are to be construed similarly.

Singular forms "a", "an" and "the" in the present disclosure are intended to include the plural forms as well, unless the context clearly indicates otherwise.

Devices that are in communication with each other are not required to be in continuous communication with each other, unless expressly specified otherwise. In addition, devices that are in communication with each other possibly communicate directly or possibly communicate indirectly through one or more intermediaries.

Although process steps, method steps, algorithms, or the like, are described in a sequential order, such processes, methods and algorithms are possibly configured to work in alternate orders. In other words, any sequence or order of steps that is described does not necessarily indicate a requirement that the steps be performed in that order. The steps of the processes, methods or algorithms described herein are possibly performed in any order practical. Further, some steps are possibly performed simultaneously.

When a single device or article is described herein, it is to be readily apparent that more than one device or article is optionally used in place of a single device or article. Similarly, where more than one device or article is described herein, it is to be readily apparent that a single device or article is optionally used in place of the more than one device or article. Also, the functionality or the features of a device may be alternatively embodied appropriately by one or more other devices that are not explicitly described as having such functionality or features.

One embodiment proposes to change an output phase of a Hall device to remove an offset voltage of the Hall device and an amplifier and to improve performance of an analog to digital converter.

One embodiment proposes to make a rising time loss quantity of an amplifier and a falling time loss quantity of an amplifier be identical to each other in a certain section to remove an offset voltage of the amplifier.

One embodiment proposes to control an output of a Hall device so that an output phase alteration order of a first section corresponds to the output phase alteration order of a second section to minimize a remaining offset voltage of an amplifier generated at a leakage integrator.

According to one embodiment, a method for controlling of Hall device and magnetic detection apparatus using the same changes an output phase of a Hall device to remove an offset voltage of the Hall device and an amplifier and to improve performance of an analog to digital converter.

According to one embodiment, a method for controlling of Hall device and magnetic detection apparatus using the same makes a rising time loss quantity of an amplifier and a falling time loss quantity of an amplifier be identical to each other in a certain section to remove an offset voltage of the amplifier.

According to one embodiment, a method for controlling of Hall device and magnetic detection apparatus using the same controls an output of a Hall device in order that an output phase alteration order of a first section corresponds to the output phase alteration order of a second section to minimize remaining offset voltage of an amplifier generated at a leakage integrator.

FIG. 1 a circuit diagram illustrating a magnetic detection apparatus according to an embodiment.

Referring to the embodiment of FIG. 1, a magnetic detection apparatus 100 includes a Hall device 110, a Hall output control unit or Hall output controller 120, an amplifier 130, an amplifier output control unit or amplifier output controller 140, an integrator 150, and an analog to digital converter 160.

For example, the Hall device 110 includes a plurality of terminals and generates an electromotive force based on a magnetic field. More specifically, a Hall device 110 corresponds to a magnetic sensor that uses a Hall effect to measure a direction of a magnetic field or intensity. Here, the Hall effect is the phenomenon of the production of a voltage difference, also known as the Hall voltage, across an electrical conductor. The Hall voltage is transverse to an electric current in the conductor and a magnetic field perpendicular to the current. For example, the Hall device 110 receives a bias current $I_{DD}$ from a bias supply $V_{DD}$ to produce a magnetic field and generate an output voltage $V_H$ at an output terminal based on the produced magnetic field.

In one embodiment, a Hall device 110 includes four terminals. In this embodiment, two terminals correspond to bias terminals and two terminals correspond to output terminals. Output terminals and bias terminals are selected by the Hall output controller 120 and a direction of a bias current $I_{DD}$ and a phase of an output voltage $V_H$ are then determined by a location of output terminals and bias terminals. Output terminals are connected to input terminals of an amplifier 130 and bias terminals are supplied with a bias current $I_{DD}$ from a bias supply $V_{DD}$.

In an example, the Hall output controller 120 selects two output terminals from among a plurality of terminals of the Hall device 110 and changes an output phase of the Hall device 110. For example, the Hall output controller 120 changes an output phase of the Hall device 110 to a value of 0 degrees, 90 degrees, 180 degrees, or 270 degrees. The Hall output controller 120 selects two output terminals that are symmetrical to each other from among a plurality of terminals of the Hall device 110. For example, the Hall device 110 generates each output voltage $V_H$ according to a phase change. The Hall output controller 120 selects the other terminals except for output terminals of a plurality of terminals with bias terminals. That is, a Hall output controller 120 connects output terminals of a Hall device 110 to input terminals of an amplifier 130 and connects bias terminals of a Hall device 110 to a bias supply $V_{DD}$ and a ground GHD.

In one embodiment, when a Hall device 110 includes four terminals, a Hall output controller 120 selects two terminals with output terminals and selects the remaining two terminals with bias terminals. Herein, two output terminals, are possibly, but are not necessarily limited to, an approach where the two output terminals are separately located in opposite positions. When the two output terminals are separately located in opposite positions, two bias terminals are also separately located in opposite positions.

An amplifier 130 is connected to output terminals of the Hall device 110 and amplifies output of the Hall device 110.

In one embodiment, an output $V_1$ of the amplifier 130 corresponds to a sum of an output $V_H$ of the Hall device 110, an offset voltage $V_{OH}$ of the Hall device 110 and an offset voltage $V_{OA}$ of the amplifier 130, such that $V_1=V_H+V_{OH}+V_{OA}$. Herein, in this example, an output of a Hall device 110 and an amplifier 130 include each of the prospective offset voltages $V_{OH}$ and $V_{OA}$. In FIGS. 2A-2D, 3, and 4, a process for removing an offset voltage $V_{OH}$ of the Hall device 110 and an offset voltage $V_{OA}$ of the amplifier 130 is explained in further detail.

In this embodiment, an amplifier output controller 140 controls an output polarity of an amplifier 130 based on an output of a Hall device 110. More specifically, an amplifier output controller 140 controls an output polarity of an amplifier 130 based on output terminals of a Hall device 110 selected by a Hall output controller 120. That is, an amplifier output controller 140 constantly maintains a phase of an amplifier output $V_1$ or changes the phase to 180 degrees. In the examples of FIGS. 2A-2D, an output polarity control process of an amplifier 130 is explained in further detail.

An integrator 150 integrates an output $V_2$ of an amplifier output controller 140. An integrator 150 accumulates an output of an amplifier output controller 140. In one embodiment, an integrator 150 adds outputs of an amplifier output controller 140 generated in a process for changing an output phase of a Hall device 110 to 0 degrees, 90 degrees, 180 degrees, and 270 degrees. An output $V_3$ of an integrator 150 is provided to an analog to digital converter 160.

An analog to digital converter 160 changes an output $V_3$ of an integrator 150 corresponding to an analog value into a digital value. That is, a magnetic detection apparatus 100 uses a Hall device 110 to quickly and accurately measure magnetic phenomena.

FIGS. 2A-2D are drawings illustrating that a Hall output controller changes an output phase of a Hall device in the embodiment of FIG. 1.

In FIGS. 2A-2D, each symbol is defined as in the following. $V_1$ corresponds to an output voltage of an amplifier 130. $V_2$ corresponds to an output voltage of an amplifier output control unit 140. $V_3$ corresponds to an output voltage of an integrator 150. $V_{OH}$ corresponds to a Hall offset voltage or offset voltage of a Hall device 110. $V_{OA}$ corresponds to an amplifier offset voltage or offset voltage of an amplifier 130. $V_{OH1}$ corresponds to an offset voltage of a Hall device of a first Hall offset voltage or an output $V_1$ of an amplifier. $V_{OH2}$ corresponds to an offset voltage of a Hall device of a second Hall offset voltage or an output $V_2$ of an amplifier. $V_{OH3}$ corresponds to an offset voltage of a Hall device of a third Hall offset voltage or an output $V_3$ of an integrator. $V_{OA1}$ corresponds to an amplifier offset voltage of a first amplifier offset voltage or an output $V_1$ of an amplifier. $V_{OA2}$ corresponds to an amplifier offset voltage of a second amplifier offset voltage or an output $V_2$ of an amplifier output control unit. $V_{OA3}$ corresponds to an amplifier offset voltage of a third amplifier offset voltage or an output $V_3$ of an integrator. $V_{OH3L}$ corresponds to a Hall offset voltage of a third Hall offset voltage of a leakage integrator or output of a leakage integrator. $V_{OA3L}$ corresponds to an amplifier offset voltage of a third amplifier offset voltage of a leakage integrator or output of a leakage integrator. $V_{DD}$ corresponds to a bias supply voltage, $I_{DD}$ corresponds to a bias current, and GVD corresponds to a ground.

Referring to FIGS. 2A-2D, the Hall output controller 120 determines a direction of a bias current passing through the Hall device 110.

Figure 2A:
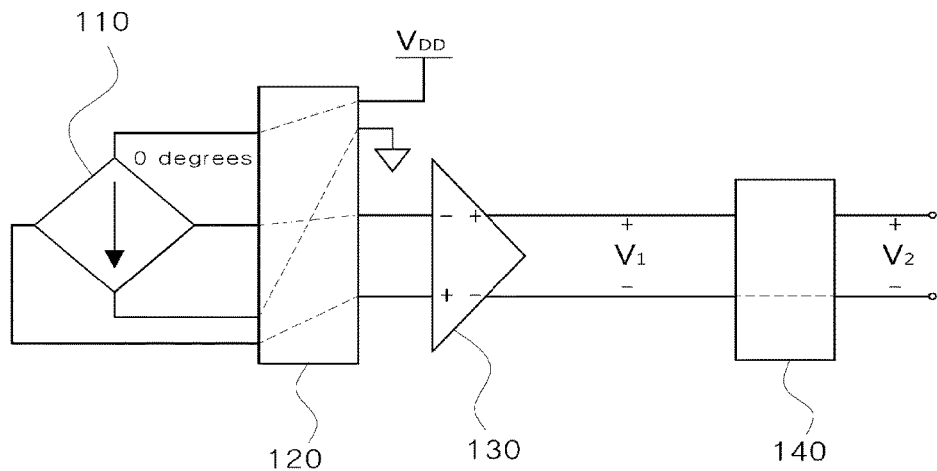
FIGS. 2A-2D are drawings illustrating how a Hall output controller changes an output phase of a Hall device in the embodiment of FIG. 1.

In FIG. 2A, the Hall output controller 120 selects an upper terminal and a lower terminal of a Hall device 110 to be bias terminals and selects a left terminal and a right terminal to be output terminals, such that $V_1=V_H+V_{OH}+V_{OA}$. That is, a bias current $I_{DD}$ flows from an upper terminal to a lower terminal, if a direction of the bias current $I_{DD}$ is 0 degrees. That is, a Hall output controller 120 connects an upper terminal of a Hall device 110 to a bias supply $V_{DD}$ and connects a lower terminal of a Hall device 110 to a ground GVD. Also, a Hall output controller 120 connects a left terminal of a Hall device 110 to a positive input terminal of an amplifier 130 and connects a right terminal of a Hall device 110 to a negative input terminal of an amplifier 130.

In one embodiment, when a direction of a bias current $I_{DD}$ is 0 degrees, an amplifier output controller 140 constantly maintains a phase of an amplifier output. That is, when a bias current $I_{DD}$ is 0 degrees, an output $V_1$ of an amplifier is identical to an output $V_2$ of an amplifier output controller 140, such that $V_1=V_2$.

Figure 2B:
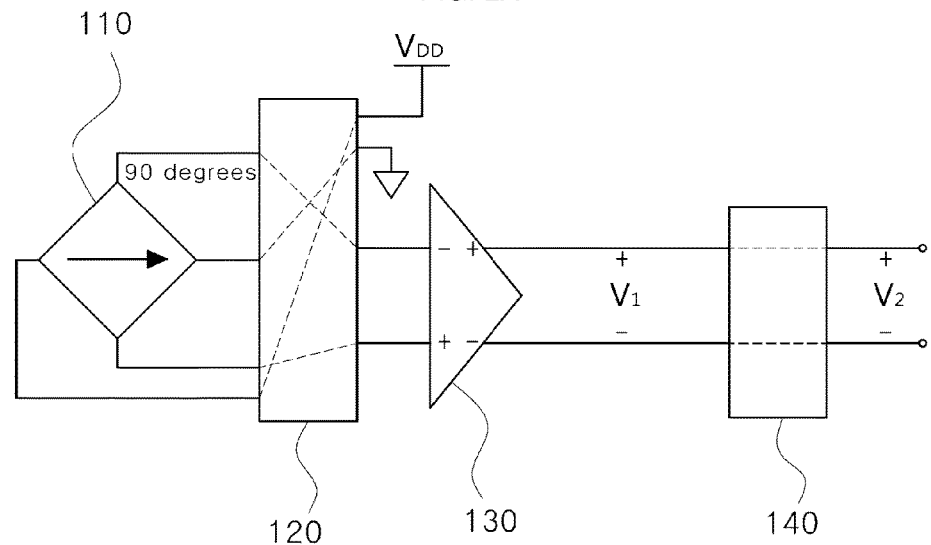

In FIG. 2B, a Hall output controller 120 selects a left terminal and a right terminal of the Hall device 110 to be bias terminals and selects the lower terminal and upper terminals to be output terminals, such that $V_1=V_H-V_{OH}+V_{OA}$. That is, a bias current $I_{DD}$ flows from a left terminal of a Hall device 110 to a right terminal if a direction of the bias current $I_{DD}$ is 90 degrees. Also, a Hall output controller 120 connects the left terminal of the Hall device 110 to a bias supply voltage $V_{DD}$ and connects the right terminal of the Hall device 110 to the ground GVD. Also, a Hall output controller 120 connects a lower terminal of the Hall device 110 to a positive input terminal of an amplifier 130 and connects an upper terminal of the Hall device 110 to a negative input terminal of the amplifier 130.

In one embodiment, when a direction of a bias current $I_{DD}$ is 90 degrees, an amplifier output controller 140 constantly maintains a phase of an amplifier output. That is, in this embodiment, when a direction of a bias current $I_{DD}$ is 90 degrees, an output $V_1$ of an amplifier is identical to an output $V_2$ of an amplifier output controller 140, such that $V_1=V_2$.

Figure 2C:
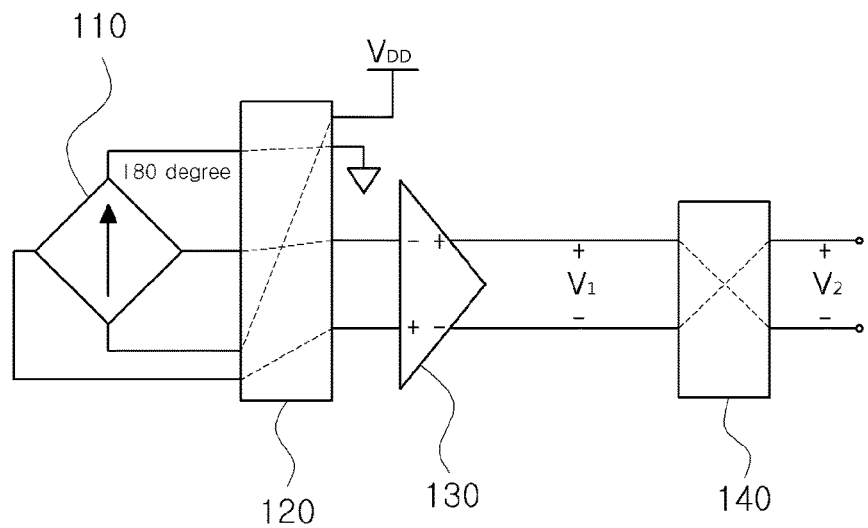

In FIG. 2C, the Hall output controller 120 selects a lower terminal and an upper terminal of the Hall device 110 to be bias terminals and selects a left terminal and a right terminal to be output terminal, such that $V_1=-V_H-V_{OH}+V_{OA}$. That is, a bias current $I_{DD}$ flows from a lower terminal of the Hall device 110 to an upper terminal if a direction of the bias current $I_{DD}$ is 180 degrees. That is, the Hall output controller 120 connects a lower terminal of the Hall device 110 to a bias supply $V_{DD}$ and connects an upper terminal of the Hall device 110 to a ground GVD. Also, the Hall output controller 120 connects a left terminal of the Hall device 110 to a positive input terminal of the amplifier 130 and connects a right terminal of the Hall device 110 to a negative input terminal of the amplifier 130.

In one embodiment, when a direction of a bias current $I_{DD}$ is 180 degrees, an amplifier output controller 140 changes a phase of the amplifier output to 180 degrees. That is, when a direction of a bias current $I_{DD}$ is 180 degree, a phase difference of an amplifier output $V_1$ and an amplifier output controller output $V_2$ corresponds to 180 degrees, such that $V_1=-V_2$.

Figure 2D:
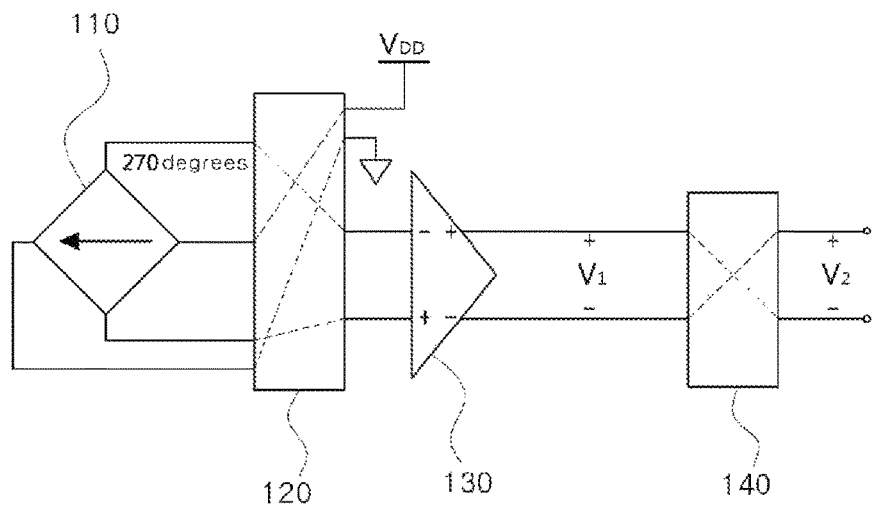

In FIG. 2D, the Hall output controller 120 selects a right terminal and a left terminal of the Hall device 110 to be bias terminals and selects a lower terminal and an upper terminal to be output terminals, such that $V_1=-V_H+V_{OH}+V_{OA}$. That is, a bias current $I_{DD}$ flows from a right terminal of the Hall device 110 into a left terminal if a direction of the bias current $I_{DD}$ is 270 degrees. That is, the Hall output controller 120 connects a right terminal of a Hall device 110 to a bias supply $V_{DD}$ and connects a left terminal of the Hall device 110 to a ground GVD. Also, in this embodiment, the Hall output controller 120 connects a lower terminal of the Hall device 110 to a positive input terminal of the amplifier 130, and connects an upper terminal of the Hall device 110 to a negative input terminal of the amplifier 130.

In one embodiment, when the direction of a bias current $I_{DD}$ is 270 degrees, an amplifier output controller 140 changes the phase of the amplifier output to 180 degrees. That is, when the direction of the bias current $I_{DD}$ is 270 degrees, the phase difference of the amplifier output $V_1$ and the amplifier output controller output $V_2$ corresponds to 180 degrees, such that $V_1=-V_2$.

Likewise, according to this example, the output $V_1$ of an amplifier and the output $V_2$ of an amplifier output controller is summarized by the following Table 1 according to the output phase of the Hall device 110.

TABLE 1

| Drawing | Output Phase | $V_1$ | $V_2$ |
| --- | --- | --- | --- |
| FIG. 2A | 0 degrees | $V_H + V_{OH} + V_{OA}$ | $V_1 = V_H + V_{OH} + V_{OA}$ |
| FIG. 2B | 90 degrees | $V_H - V_{OH} + V_{OA}$ | $V_1 = V_H - V_{OH} + V_{OA}$ |
| FIG. 2C | 180 degrees | $-V_H - V_{OH} + V_{OA}$ | $-V_1 = V_H - V_{OH} + V_{OA}$ |
| FIG. 2D | 270 degrees | $-V_H + V_{OH} + V_{OA}$ | $-V_1 = V_H - V_{OH} - V_{OA}$ |
| Sum | | 0 | $4V_H$ |

As per table 1, the output $V_3$ of the integrator is generated based on the output $V_1$ of an amplifier and the output $V_2$ of an amplifier output controller and corresponds to the output $4*V_H$ of the Hall device. More specifically, the output $V_3$ of the integrator is offset by a Hall offset voltage $V_{OH}$ and an amplifier offset voltage $V_{OA}$ in the process of an output phase alteration of the Hall device 110 to remain only as an output component of the Hall device 110. Therefore, the magnetic detection apparatus 100 removes a prospective offset voltage, thereby improving its performance.

Thus, the Hall output controller 120 controls an output of the Hall device 110 such that an output phase alteration order of a first section is symmetrical to an output phase alteration order of a second section on the basis of a half cycle of a control cycle of the Hall device 110. The Hall output controller 120 controls the output $V_H$ of the Hall device 100 so that the output phase alteration order of a first section during the certain section is corresponds to the reverse of the order of an output phase alteration order of a second section during the certain section. For example, a control cycle of the Hall device 110 corresponds to a section in which an output phase of the Hall device 110 is changed 8 times. More specifically, the Hall output controller 120 changes the output phase of the Hall device 100 4 times during the first section and the output phase of the Hall device 110 4 times in reverse order of the output phase alteration order of the first section during the second section.

In an embodiment, the Hall output controller 120 changes a direction of the bias current $I_{DD}$ to change the output phase of the Hall device 110. That is, the Hall output controller 120 changes the direction of the bias current $I_{DD}$ to an order of 0 degrees, 90 degrees, 180 degrees, and 270 degrees in a first section, and 270 degrees, 180 degrees, 90 degrees and 0 degrees in a second section to control the output $V_H$ of the Hall device 110. That is, in such an embodiment, the output phase alteration order of a first section is symmetrical to the output phase alteration order of a second section on the basis of a half cycle of a control cycle of the Hall device 110. For example, the output phase alteration order of the Hall device 110 is summarized in the following Table 2.

TABLE 2

| Embodiment | Output Control Method of a Hall Device |
| --- | --- |
| A first embodiment | 0 degrees → 90 degrees → 180 degrees → 270 degrees |
|  | 0 degrees ← 90 degrees ← 180 degrees ← 270 degrees |
| A second embodiment | 0 degrees → 180 degrees → 90 degrees → 270 degrees |
|  | 0 degrees ← 180 degrees ← 90 degrees ← 270 degrees |
| A third embodiment | 0 degrees → 90 degrees → 270 degrees → 180 degrees |
|  | 0 degrees ← 90 degrees ← 270 degrees ← 180 degrees |
| A fourth embodiment | 180 degrees → 0 degrees → 270 degrees → 90 degrees |
|  | 180 degrees ← 0 degrees ← 270 degrees ← 90 degrees |

As illustrated in Table 2, an output phase of the Hall device 110 is changed in phase 8 times during a control cycle of the Hall device 110. An output phase of the Hall device 110 corresponds to 0 degrees, 90 degrees, 180 degrees, and 270 degrees. The magnetic detection apparatus 100 controls the output phase during one cycle of the Hall device 110 to remove a prospective offset voltage and a remaining offset voltage.

The Hall output controller 120 controls an output of the Hall device 110 so that the output $V_3$ of the integrator corresponds to zero at the last point of the certain section related to the output phase of the Hall device 110. Here, the certain section corresponds to sum of a first and a second section. Further, in this embodiment, the first and the second section optionally, but are not necessarily limited to, each include four sections. In the following description, the direction of the bias current $I_{DD}$ corresponds to 0 degrees in the 1-1 section and the 2-4 section, 90 degrees in the 1-2 section and the 2-3 section, 180 degrees in the 1-3 section and the 2-2 section and 270 degrees in the 1-4 section and the 2-1 section. Thus, the control cycle of the Hall device corresponds to a sum of the first and the second section. For example, the 1-1 section and 2-4 section, the 1-2 section and 2-3 section, the 1-3 section and 2-2 section and the 1-4 section and 2-1 section have the same output phase.

In the following description, a remaining offset voltage generation process and a remaining offset voltage removal process are explained in further detail.

FIG. 3 is a waveform diagram illustrating an offset voltage change of a Hall device according to an output phase change of the Hall device in respect of alternative technology.

In FIG. 3, the output phase of the Hall device is changed in an order of 0 degrees, 90 degrees, 270 degrees and 180 degrees. That is, the output phase of the Hall device is changed 4 times during one control cycle. The first Hall offset voltage $V_{OH1}$ according to alternative technology possibly has a falling time $T_F$ and a rising time $T_R$. However, in an example, a rising time 320 and a falling time 310 of the second Hall offset voltage $V_{OH2}$ according to alternative technology are identical to each other and rising time loss and falling time loss are also identical to each other. Therefore, in the example of FIG. 3, a remaining offset voltage is not generated. However, in the example of FIG. 3, there is a problem in that the amplifier offset voltage of the integrator output is possibly removed because the amplifier offset voltage of the output of the amplifier is possibly integrated asymmetrically.

FIG. 4 is a waveform diagram illustrating an offset voltage change of a Hall device that differs from an output phase alteration order of the Hall device as presented in FIG. 3.

In the example of FIG. 4, an output phase of a Hall device is changed 4 times in an order of 0 degrees, 90 degrees, 180 degrees, and 270 degrees during one cycle. For example, the first Hall offset voltage $V_{OH1}$ according to an alternative technology has a falling time $T_F$ and a rising time $T_R$.

When an output phase of the Hall device is changed from 0 degrees to 90 degrees, the phase of the first Hall offset voltage $V_{OH1}$ is changed by 180 degrees to fall at the first Hall offset voltage $V_{OH1}$, referred to as a Downward Phase Shift. When the output phase of the Hall device is changed by 180 degrees to 270 degrees, the phase of the first Hall offset voltage $V_{OH1}$ is changed by 180 degrees to rise by a first Hall offset voltage $V_{OH1}$. When the phase of the first Hall offset voltage $V_{OH1}$ is changed, a phase alteration time is generated. Herein, when a phase of a first Hall offset voltage $V_{OH1}$ is changed and its amplitude falls during a Downward Phase Shift, the phase alteration time corresponds to a falling time $T_F$. When the phase of the first Hall offset voltage $V_{OH1}$ is changed and its amplitude rises, referred to as an Upward Phase Shift, the phase alteration time corresponds to a rising time $T_R$.

In an example, a second Hall offset voltage $V_{OH2}$ according to an alternative technology generate only falling times 410, 420 without rising time to generate only a falling time loss. Therefore, in the example of FIG. 4, a prospective offset voltage is removed. However a remaining offset voltage is still produced. That is, a remaining offset voltage gradually increases in an integrator according to such alternative technology.

Figure 5:
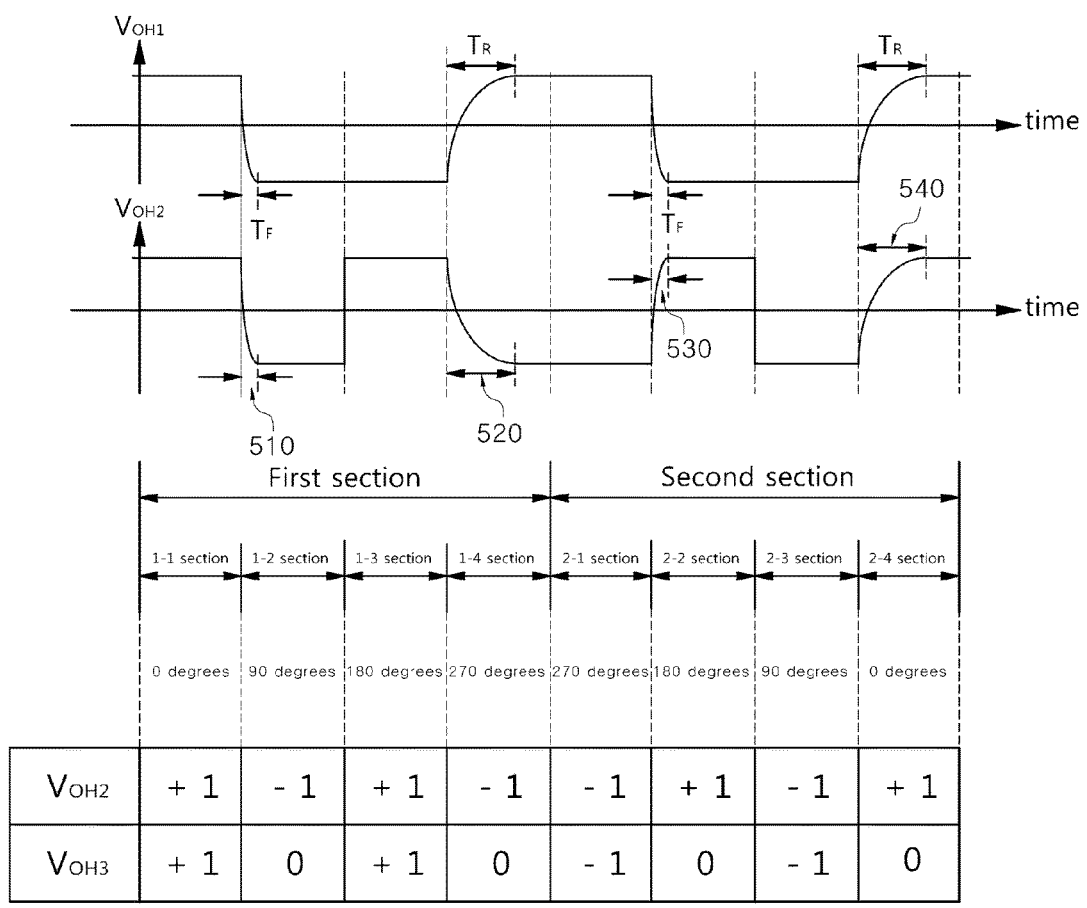
FIG. 5 is a waveform diagram illustrating an offset voltage change of a Hall device according to an output phase change of the Hall device in the embodiment of FIG. 1.

FIG. 5 is a waveform diagram illustrating an offset voltage change of a Hall device according to an output phase change of the Hall device in the embodiment of FIG. 1.

In the example of FIG. 5, the output $V_1$ of an amplifier includes the first Hall offset voltage and the output $V_2$ of the amplifier output controller includes the second Hall offset voltage. When the output phase of the Hall device 110 is 0 degrees, the output $V_1$ of the amplifier and the output $V_2$ of the amplifier output controller is as follows.

Here, $V_1 = V_H + V_{OH1} + V_{O4}$. Additionally, $V_2 = V_H + V_{OH2} + V_{O4}$.

The offset voltage $V_{OH}$ of the Hall device 110 of the amplifier output $V_1$ is taken to be the first Hall offset voltage $V_{OH1}$. Also, the offset voltage $V_{OH}$ of a Hall device 110 of an output $V_2$ of an amplifier output controller 140 is taken to be the second Hall offset voltage $V_{OH2}$. That is, the output $V_1$ of the amplifier 130 corresponds to a sum of the output $V_H$ of the Hall device 110, the first Hall offset voltage $V_{OH1}$ and the offset voltage $V_{OA}$ of an amplifier 130 and the output $V_2$ of the amplifier output controller 140 corresponds to a sum of the output $V_H$ of a Hall device 110, the second Hall offset voltage $V_{OH2}$ and the offset voltage $V_{OA}$ of the amplifier 130.

In one embodiment, when the direction of the bias current $I_{DD}$ is 0 degrees, such as at the 1-1 section or 2-4 section, the first Hall offset voltage $V_{OH1}$ corresponds to the second Hall offset voltage $V_{OH2}$ because the amplifier output controller 140 maintains a constant phase of the amplifier output, such that $V_{OH1}=V_{OH2}$.

In one embodiment, when the direction of the bias current $I_{DD}$ is 90 degrees, such as at the 1-2 section or 2-3 section, the first Hall offset voltage $V_{OH1}$ corresponds to the second Hall offset voltage $V_{OH2}$ because the amplifier output controller 140 maintains a constant phase of the amplifier output, such that $V_{OH1}=V_{OH2}$.

In one embodiment, when the direction of the bias current $I_{DD}$ is 180 degrees, such as at the 1-3 section or 2-2 section, the difference of the phase of the first Hall offset voltage $V_{OH1}$ and the phase of the second Hall offset voltage $V_{OH2}$ corresponds to 180 degrees because the amplifier output controller 140 changes the phase of the amplifier output to 180 degrees, such that $V_{OH1}=-V_{OH2}$.

In one embodiment, when the direction of the bias current $I_{DD}$ is 270 degrees, such as at the 1-4 section or 2-1 section, the difference of the phase of the first Hall offset voltage $V_{OH1}$ and the phase of the second Hall offset voltage $V_{OH2}$ corresponds to 180 degrees because the amplifier output controller 140 changes the phase of the amplifier output to 180 degrees, such that $V_{OH1}=-V_{OH2}$.

Though the second Hall offset voltage $V_{OH2}$ generates a falling time 510 in the 1-2 section, in this example, a same rising time 530 is generated in the 2-2 section. That is, a remaining offset voltage generated in the 1-2 section is removed in the 2-2 section. Because the rising time loss and the falling time loss are the same, the remaining offset voltages offset each other.

Also, though the second Hall offset voltage $V_{OH2}$ generates a falling time 520 in 1-4 section, a same rising time 540 is generated in the 2-4 section. That is, a sum of the falling times 510, 520 of the first section corresponds to a sum of the rising times 530, 540 of the second section. Therefore, in an embodiment, because a difference of the falling times 510, 520 and the rising times 530, 540 of the second Hall offset voltage $V_{OH2}$ is zero, remaining offset voltages are offset. As a result, the second Hall offset voltage $V_{OH2}$ is removed from an integrator output $V_3$ with respect to one control cycle of a Hall device 110.

In an embodiment, that second amplifier offset voltage $V_{OA2}$ is removed from the integrator output $V_3$ based on an identical principle with respect to the second Hall offset voltage $V_{OH2}$. That is, the wave of the first amplifier offset voltage $V_{OA1}$ and the second amplifier offset voltage $V_{OA2}$ have a similar wave to that of the first Hall offset voltage $V_{OH1}$ and the second Hall offset voltage $V_{OH2}$ as illustrated in FIG. 5. Therefore, an amplifier output controller 140 controls a polarity of the first amplifier offset voltage $V_{OA1}$ based on the output of the Hall device 110 and makes a sum of the rising time $T_R$ and a sum of the falling time $T_F$ be identical to one another to remove the remaining offset voltage generated from the second amplifier offset voltage $V_{OA2}$.

An output phase, an output $V_1$ of an amplifier, an output $V_2$ of an amplifier output controller and an output $V_3$ of an amplifier in respect of each section of control cycle of a Hall device 110 may be summarized as the following Table 3.

TABLE 3

| Section | Output phase | $V_1$ | $V_2$ | $V_3$ |
|---|---|---|---|---|
| 1-1 | 0 degrees | $V_H + V_{OH} + V_{OA1}$ | $V_1 = V_H + V_{OH2} + V_{OA2}$ | $V_H + V_{OH3} + V_{OA3}$ |
| 1-2 | 90 degrees | $V_H - V_{OH} + V_{OA1}$ | $V_1 = V_H - V_{OH2} + V_{OA2}$ | $V_H - V_{OH3} + V_{OA3}$ |
| 1-3 | 180 degrees | $-V_H - V_{OH} + V_{OA1}$ | $-V_1 = V_H + V_{OH2} + V_{OA2}$ | $V_H + V_{OH3} + V_{OA3}$ |
| 1-4 | 270 degrees | $-V_H + V_{OH} + V_{OA1}$ | $-V_1 = V_H - V_{OH2} - V_{OA2}$ | $V_H - V_{OH3} - V_{OA3}$ |
| 2-1 | 270 degrees | Same as 1-4 section | Same as 1-4 section | Same as 1-4 section |
| 2-2 | 180 degrees | Same as 1-3 section | Same as 1-3 section | Same as 1-3 section |
| 2-3 | 90 degrees | Same as 1-2 section | Same as 1-2 section | Same as 1-2 section |
| 2-4 | 0 degrees | Same as 1-1 section | Same as 1-1 section | Same as 1-1 section |

In one embodiment, the output $V_3$ of the integrator 150 corresponds to an integrated value of the output $V_2$ of the amplifier output controller 140. For example, when the amplitude range of the first Hall offset voltage $V_{OH1}$ or the second Hall offset voltage $V_{OH2}$ ranges from −1 to 1, an output $V_3$ of the integrator 150 possibly corresponds to zero at the last point of a certain section or, for example, at the last point of a second section. Therefore, the magnetic detection apparatus 100 controls the output of the Hall device 110, or, the direction of the bias current $I_{DD}$, so that the output $V_3$ of the integrator 150 corresponds to zero at a last point of the certain section to provide the remaining offset voltage generated in the removing process of the prospective offset voltage.

In one embodiment, the amplifier output controller 140 controls the output of the Hall device 110 so that the rising time loss of the amplifier 130 corresponds to the falling time loss of the amplifier 130 in a certain section. In this example, the rising time loss corresponds to the power loss during the rising time $T_R$ of the first Hall offset voltage $V_{OH1}$ and the falling time loss corresponds to the power loss during the falling time $T_F$ of the first Hall offset voltage $V_{OH1}$. For example, the amplifier output controller 140 makes the rising time $T_R$ of the first Hall offset voltage $V_{OH1}$ be identical to the falling time 320 or the rising time 340 of a second Hall offset voltage $V_{OH2}$ and makes a falling time $T_F$ of a first Hall offset voltage $V_{OH1}$ be identical to the falling time 310 or the rising time 330 of the second Hall offset voltage $V_{OH2}$. Therefore, the amplifier output controller 140 makes the rising time loss and the falling time loss be identical to each other to remove the remaining offset voltage of the amplifier 130.

FIG. 6 is a waveform diagram illustrating an output of an integrator in the embodiment of FIG. 1.

In FIG. 6A, an offset voltage $V_{OH}$ of the Hall device 110 of the output $V_3$ of a leaky integrator is based on the third Hall offset voltage $V_{OH3L}$ of the leaky integrator and the offset voltage $V_{OH}$ of the Hall device 110 of the output $V_3$ of the ideal integrator is based on the third Hall offset voltage $V_{OH3I}$ of an ideal integrator. Herein, a leaky integrator corresponds to the integrator 150 included in the magnetic detection apparatus 100.

In one embodiment, a difference of the third Hall offset voltage $V_{OH3L}$ of a leaky integrator and the third Hall offset voltage $V_{OH3I}$ of an ideal integrator corresponds to a type of an error and the larger an error is, the more different a performance of a leaky integrator is from a performance of an ideal integrator. A magnetic detection apparatus outputs a difference by a leaky integrator and an ideal integrator, which is desirably a zero difference.

In the examples of FIGS. 6A-6B, an x axis corresponds to a phase section and each section of a control cycle of the Hall device 110. The third Hall offset voltage $V_{OH3}$ corresponds to a value of integrating with the second Hall offset voltage $V_{OH2}$ in the previous section and the third amplifier offset voltage $V_{OA3}$ corresponds to a value of integrating with the second amplifier offset voltage $V_{OA2}$ in the previous section.

A second Hall offset voltage $V_{OH2}$ and a third Hall offset voltage $V_{OH3}$ are summarized in the following Table 4 for each section.

TABLE 4

| Section | 1-1 | 1-2 | 1-3 | 1-4 | 2-1 | 2-2 | 2-3 | 2-4 |
|---|---|---|---|---|---|---|---|---|
| $V_{OH2}$ | 1 | −1 | 1 | −1 | −1 | 1 | −1 | 1 |
| $V_{OH3}$ | 1 | 0 | 1 | 0 | −1 | 0 | −1 | 0 |

In Table 4, the third Hall offset voltage $V_{OH3}$ corresponds to the third Hall offset voltage $V_{OH3L}$ of a leaky integrator in FIG. 4A. Here, the amplitude of the second Hall offset voltage $V_{OH2}$ is supposed to have a level of 1 or −1. That is, when a final point of a control cycle of a Hall device 110 corresponds to the 2-4 section, the third Hall offset voltage $V_{OH3}$ is zero. Therefore, the magnetic detection apparatus 100 removes a remaining offset voltage of a Hall device 110 that is shown as occurring on an output $V_3$ of the integrator.

In FIG. 6A, the waveform of the third Hall offset voltage $V_{OH3L}$ of a leaky integrator and the third Hall offset voltage $V_{OH3I}$ of an ideal integrator may have a value closer to zero at a final point of one control cycle. That is, in such an example, a magnetic detection apparatus 100 uses a leaky integrator 150 in a manner that allows it to have an effect that is closer to that of an ideal integrator.

In FIG. 6B, the offset voltage $V_{OA}$ of the amplifier 130 of the output $V_3$ of the leaky integrator supposes the third amplifier offset voltage $V_{OA3L}$ of the leaky integrator and an offset voltage $V_{OA}$ of the amplifier 130 of the output $V_3$ of the ideal integrator supposes the third amplifier offset voltage $V_{OA3I}$ of the ideal integrator. Here, the waveform of the third amplifier offset voltage $V_{OH3L}$ of a leaky integrator and the third amplifier offset voltage of an ideal integrator have a value closer to zero at a last point of one control cycle. That is, in such an example, the magnetic detection apparatus 100 uses a leaky integrator 150 to have an effect closer to that of an ideal integrator.

Thus, the second amplifier offset voltage $V_{OA2}$ and the third amplifier offset voltage $V_{OA3}$ are be summarized as per the following Table 5 in each section.

TABLE 5

| Section | 1-1 | 1-2 | 1-3 | 1-4 | 2-1 | 2-2 | 2-3 | 2-4 |
|---|---|---|---|---|---|---|---|---|
| $V_{OA2}$ | 1 | 1 | −1 | −1 | −1 | −1 | 1 | 1 |
| $V_{OA3}$ | 1 | 2 | 1 | 0 | −1 | −2 | −1 | 0 |

In Table 5, a third amplifier offset voltage $V_{OA3}$ corresponds to a third amplifier offset voltage $V_{OA3L}$ of the leaky integrator of FIG. 6B. Herein, an amplitude of the second amplifier offset voltage $V_{OA2}$ takes on values of 1 or −1. That is, when a last point of a control cycle of the Hall device 110 corresponds to the 2-4 section, the third amplifier offset voltage $V_{OA3}$ is zero. Therefore, a magnetic detection apparatus 100 removes a remaining offset voltage of the Hall device 110 showing on the output $V_3$ of the integrator to reduce an absolute value of the initial offset voltage and to easily adjust the initial offset voltage.

Figure 7A:
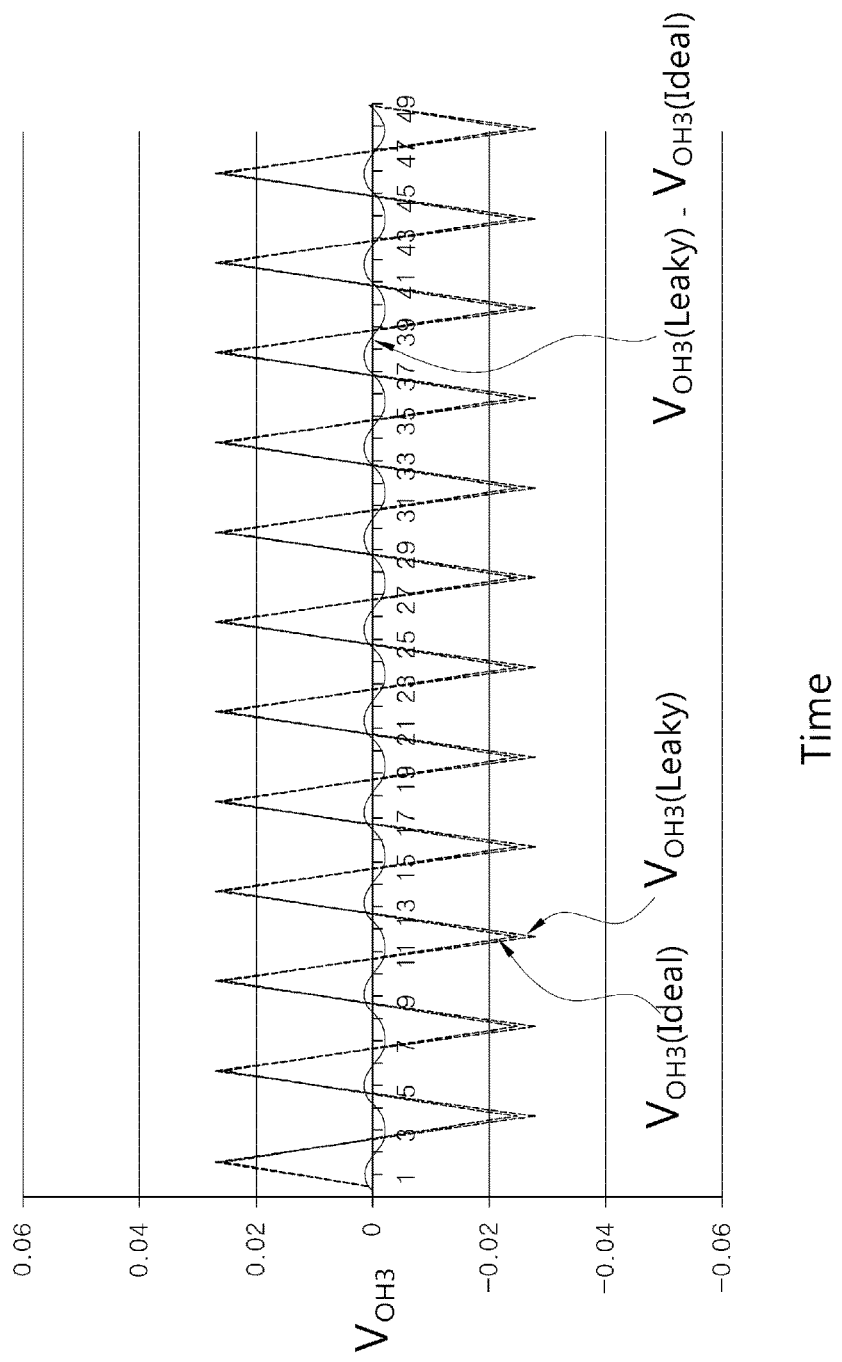
FIG. 7A is a waveform diagram illustrating an output of an integrator in respect of an offset voltage of a Hall device of a magnetic detection apparatus according to an alternative technology.
Figure 7B:
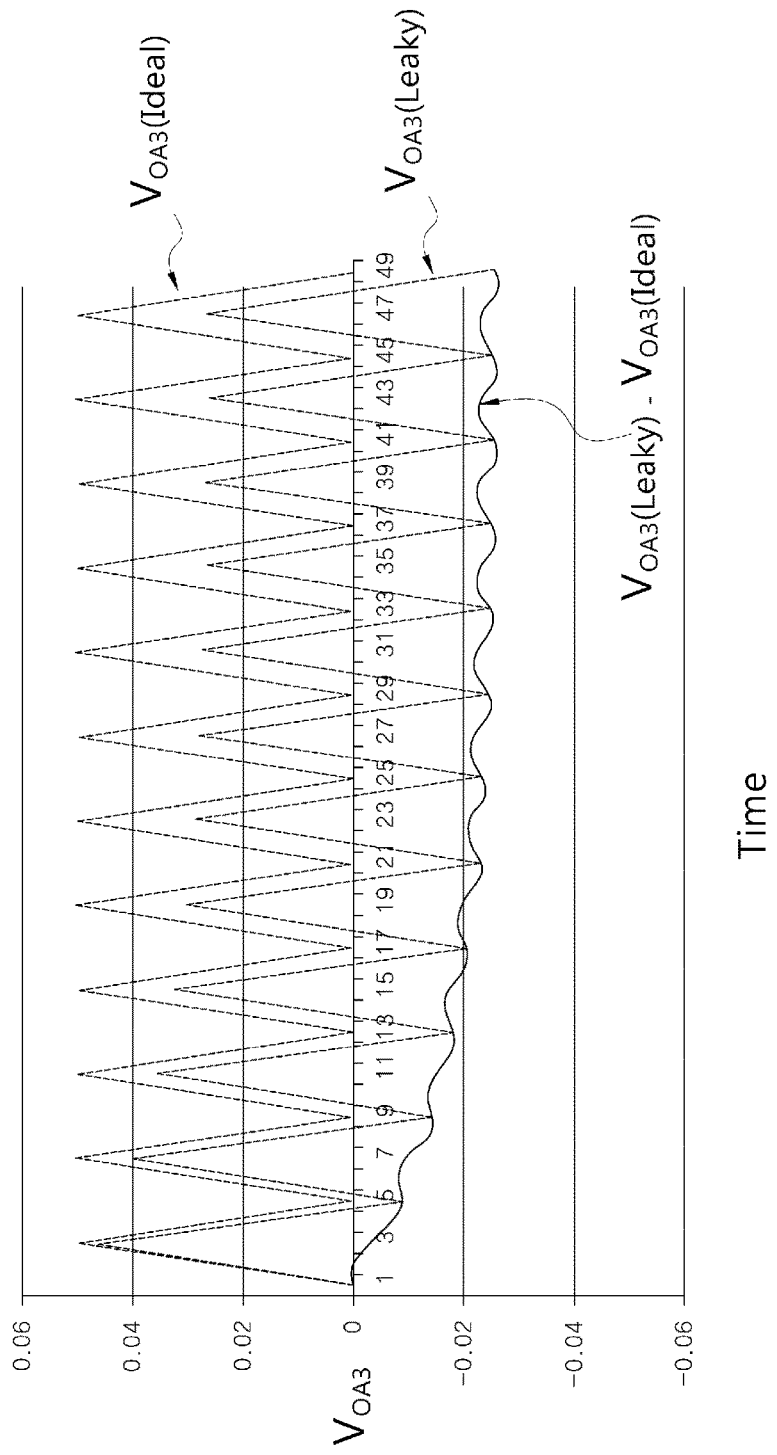
FIG. 7B is a waveform diagram illustrating an output of an integrator in respect of an offset voltage of an amplifier of a magnetic detection apparatus according to an alternative technology.

FIGS. 7A-7B are waveform diagrams illustrating an output of the integrator with respect to an offset voltage of a Hall device of a magnetic detection apparatus according to alternative technology. Herein, FIGS. 7A-7B illustrate an offset voltage generated by an output phase alteration controlled by an alternative method that differs from features of the present embodiments. FIGS. 7A-7B correspond to an integrator output by an output phase control method illustrated in the examples of FIG. 3 and FIG. 4. That is, FIG. 7 corresponds to an integrator output based on an output phase formed asymmetrically on the basis of a half cycle of the output phase control cycle. When the output of the amplifier is asymmetrically based on a zero voltage value in one cycle of the output phase control cycle, the amplifier offset voltage of the integrator output is outputted asymmetrically based on the zero voltage value. In the example of FIG. 7A, the remaining offset voltage of the Hall device of the integrator output may be mostly removed. However, in the example of FIG. 7B, a remaining offset voltage of the amplifier of the integrator output is not mostly removed. For example, when the output phase of the Hall device is changed 4 times in an order of 0 degrees, 90 degrees, 180 degrees and 270 degrees during one cycle, the amplifier offset voltage is caused by asymmetry to cause the integral value to assume a negative value. Therefore, a difference of the amplifier offset voltage calculated using a leaky integrator and an amplifier offset voltage calculated using an ideal integrator gradually increases.

In one embodiment, an output of a leaky integrator corresponds to the following equations.

$$V_3[n+1] = P*V_3[n] + g*(x[n] - \text{sgn}(V_3[n]))$$

$$V_2[n] = V_H[n] + V_{OH}[n] + V_{OA}[n]$$

Here, $V_3[n+1]$ corresponds to an integrator output of a next cycle, $V_3[n]$ corresponds to an integrator output of the present cycle, P corresponds to a leaky integrator constant, g corresponds to an input gain, $V_2$ corresponds to an input of an integrator and sgn ($V_3[n]$) corresponds to an output of a one bit analog to digital converter of the present cycle. In one embodiment, when the integrator 150 is formed using an ideal integrator, the leaky integrator constant P is identical to an input gain g and corresponds to 1, such that P=g=1, since there is no leakage and hence no disparity between the ideal integrator and the leaky integrator.

In one embodiment, an equation for providing $V_3$ [n+1] and $V_3$ [n] is summarized by the following.

$$V_3[n+1] = P*V_3[n] + V_{OA}[n]$$

$$V_3[n] = \sum_{k=1}^{n} P^{n-k} * V_{OA}[k]$$

In one embodiment, FIGS. 6A-6B are illustrated based an equation used to derive $V_3[n]$.

Figure 8:
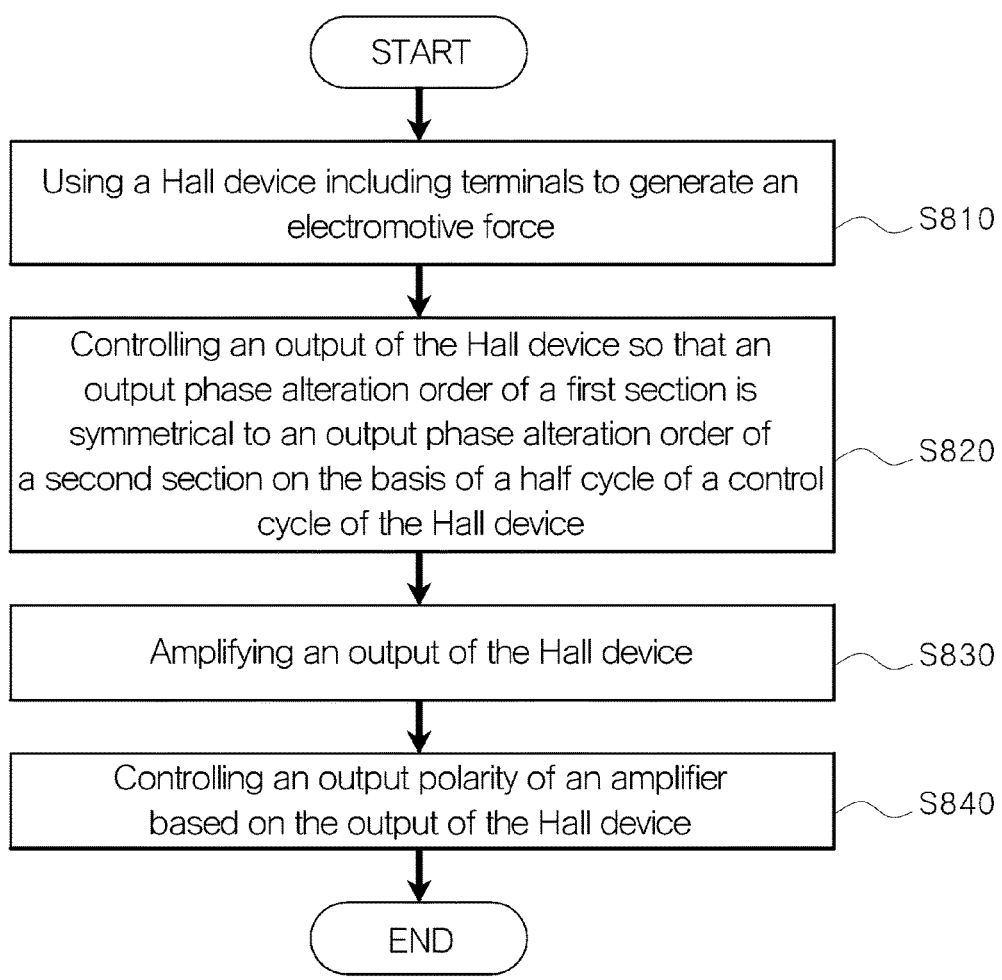
FIG. 8 is a flowchart illustrating a Hall device control method performed at a magnetic detection apparatus in the embodiment of FIG. 1.

FIG. 8 is a flowchart illustrating a Hall device control method performed at the magnetic detection apparatus in the example of FIG. 1.

In step S810, the Hall device 110 includes a plurality of terminals and generates an electromotive force based on a magnetic field.

In step S820, the Hall output controller 120 controls an output of the Hall device 110 in order that an output phase alteration order of a first section is symmetrical to an output phase alteration order of a second section on the basis of a half cycle of a control cycle of the Hall device 110.

In step S830, the amplifier 130 connects to output terminals of the Hall device 110 to amplify the output of the Hall device 110.

In step S840, an amplifier output controller 140 controls an output polarity of the amplifier based on the output of the Hall device.

Therefore, the magnetic detection apparatus 100 changes an output phase of the Hall device 110 to remove an offset voltage of the Hall device 110 and the amplifier 130 and accordingly improves performance of an analog to digital converter. Such a magnetic detection apparatus 100 improves performance of an analog to digital converter in order to increase precision of the sensor and to decrease current consumption of the converter. Also, the magnetic detection apparatus 100 controls an output of the Hall device 110 so that an output phase alteration order of a first section is cause to correspond to the reverse order of an output phase alteration order of a second section, and causes a rising time loss quantity of an amplifier and a falling time loss quantity of an amplifier to be identical to one another in a certain section to remove the offset voltage of the amplifier.

The apparatuses, units, modules, devices, and other components illustrated in FIGS. 1-8 that perform the operations described herein with respect to FIGS. 1-8 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-8. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-8 that perform the operations described herein with respect to FIGS. 1-8 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A magnetic detection apparatus, comprising:
    a Hall device configured to comprise terminals and to generate an electromotive force based on a magnetic field;
    a Hall output controller configured to control an output of the Hall device such that an output phase alteration sequence order of a first section of the output is symmetrical to an output phase alteration sequence order of a second section of the output on the basis of a half cycle of a control cycle of the Hall device;
    an amplifier configured to be connected to output terminals of the Hall device to amplify the output of the Hall device; and
    an amplifier output controller configured to control an output polarity of the amplifier based on the output of the Hall device,
    wherein the output phase alteration sequence order of the first section is different from the output phase alteration sequence order of the second section.

2. The magnetic detection apparatus of claim 1, further comprising an integrator configured to integrate an output of the amplifier output controller.

3. The magnetic detection apparatus of claim 1, wherein the Hall output controller controls the output of the Hall device such that the output phase alteration sequence order of the first section corresponds to a reverse order of the output phase alteration sequence order of the second section during the control cycle of the Hall device.

4. The magnetic detection apparatus of claim 1, wherein the control cycle of the Hall device corresponds to a section of the output in which an output phase of the Hall device changes 8 times.

5. The magnetic detection apparatus of claim 1, wherein the Hall output controller changes an output phase of the Hall device 4 times during the first section of the output and changes the output phase of the Hall device 4 times in a reverse order of the output phase alteration sequence order of the first section during the second section of the output.

6. The magnetic detection apparatus of claim 1, wherein the Hall output controller changes an output phase of the Hall device in an order of 0 degrees, 90 degrees, 180 degrees and 270 degrees during the first section of the output and changes the output phase of the Hall device in an order of 270 degrees, 180 degrees, 90 degrees and 0 degrees during the second section of the output.

7. The magnetic detection apparatus of claim 1, wherein the Hall output controller selects two output terminals from among the terminals of the Hall device to be used to change an output phase of the Hall device.

8. The magnetic detection apparatus of claim 7, wherein the Hall output controller selects terminals from among the terminals of the Hall device that are not to be used as output terminals as bias terminals.

9. The magnetic detection apparatus of claim 1, wherein the Hall output controller controls the output of the Hall device such that a rising time loss quantity related to the output the amplifier output controller is identical to a falling time loss quantity related to the output the amplifier output controller during the control cycle of the Hall device.

10. The Hall output controller of claim 9, wherein the Hall output controller causes the rising time loss quantity and the falling time loss quantity be identical to each other such that a remaining offset voltage of the amplifier is removed.

11. The magnetic detection apparatus of claim 10, wherein the Hall output controller changes the output phase of the Hall device 8 times during one control cycle of the Hall device.

12. The Hall output controller of claim 11, wherein the Hall output controller changes the output phase of the Hall device in order 0 degrees, 90 degrees, 180 degrees and 270 degrees during the first section and the output phase of the Hall device in order 270 degrees, 180 degrees, 90 degrees and 0 degrees during the second section.

13. The magnetic detection apparatus of claim 10, wherein the Hall output controller changes the output phase of the Hall device 4 times during a first section of a control cycle of the Hall device and the output phase of the Hall device 4 times in reverse order of an output phase alteration sequence order of the first section during a second section of the control cycle of the Hall device.

14. A magnetic detection apparatus, comprising:
    a Hall device configured to comprise terminals and to generate an electromotive force based on a magnetic field;
    a Hall output controller configured to select two output terminals from among the terminals to control an output phase of the Hall device;
    an amplifier configured to connect to the selected output terminals to amplify the output of the Hall device;
    an amplifier output controller configured to control an output polarity of the amplifier based on the output of the Hall device; and
    an integrator configured to integrate an output of the amplifier output controller,
    wherein the Hall output controller controls the output of the Hall device such that a rising time loss quantity related to an output of the amplifier output controller is identical to a falling time loss quantity related to an output of the amplifier output controller.

15. The magnetic detection apparatus of claim 14, wherein the Hall output controller controls the output phase of the Hall device to have more than two output phase alteration sequences in a half cycle of a control cycle of the Hall device.

16. The magnetic detection apparatus of claim 14, wherein the Hall output controller controls the output phase of the Hall device to implement different output phase alteration sequence orders, providing plural output phase alterations during one control cycle of the Hall device.

17. A method for controlling a Hall device, comprising:
    using a Hall device comprising terminals to generate an electromotive force;
    controlling an output of the Hall device so that an output phase alteration sequence order of a first section of the output is symmetrical to an output phase alteration sequence order of a second section of the output on the basis of a half cycle of a control cycle of the Hall device;

amplifying an output of the Hall device; and controlling an output polarity of an amplifier based on the output of the Hall device, wherein the output phase alteration sequence order of the first section is different from the output phase alteration sequence order of the second section.

18. The method of claim 17, further comprising integrating the controlled output of the Hall device based on the controlled output polarity of the amplifier.

19. The method of claim 17, wherein the controlling of the output of the Hall device includes controlling the output phase alteration sequence order of the first section to be a reverse order of the output phase alteration sequence order of the second section, during the control cycle of the Hall device.

* * * * *